(12) United States Patent
Takamine

(10) Patent No.: US 11,271,546 B2
(45) Date of Patent: Mar. 8, 2022

(54) FILTER CIRCUIT USING 90-DEGREE HYBRID COUPLER

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/674,013

(22) Filed: Nov. 5, 2019

(65) Prior Publication Data
US 2020/0195229 A1   Jun. 18, 2020

(30) Foreign Application Priority Data

Dec. 17, 2018 (JP) .............................. JP2018-235620

(51) Int. Cl.
| H03H 9/64 | (2006.01) |
| H03H 7/075 | (2006.01) |
| H01P 5/18 | (2006.01) |
| H03H 7/01 | (2006.01) |

(52) U.S. Cl.
CPC ............ H03H 9/6496 (2013.01); H01P 5/18 (2013.01); H03H 7/0115 (2013.01); H03H 7/075 (2013.01); H03H 9/6483 (2013.01)

(58) Field of Classification Search
CPC ............ H03H 9/54; H03H 9/64; H03H 7/075
See application file for complete search history.

(56) References Cited

U.S. PATENT DOCUMENTS

| 7,479,848 | B2* | 1/2009 | Kuroda | H03H 7/01 333/133 |
| 8,923,794 | B2* | 12/2014 | Aigner | H03H 9/02102 455/339 |
| 9,369,107 | B2* | 6/2016 | Muterspaugh | H03H 7/0123 |
| 9,564,871 | B2* | 2/2017 | Kim | H03H 7/0138 |
| 9,843,302 | B2* | 12/2017 | Analui | H03H 7/46 |
| 10,038,458 | B2* | 7/2018 | Mandegaran | H04B 1/005 |
| 2003/0058066 | A1 | 3/2003 | Taniguchi et al. | |
| 2004/0246074 | A1 | 12/2004 | Humphrey | |
| 2011/0140803 | A1 | 6/2011 | Kim et al. | |
| 2017/0099652 | A1 | 4/2017 | Mandegaran | |

FOREIGN PATENT DOCUMENTS

| JP | 2002-141771 A | 5/2002 |
| JP | 2004-343696 A | 12/2004 |
| JP | 2013-509019 A | 3/2013 |
| JP | 2016-129445 A | 7/2016 |

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

A filter circuit has a first frequency band as a pass band and a second frequency band as an attenuation band. The filter circuit includes a 90-degree hybrid coupler, a first filter that is connected to the 90-degree hybrid coupler and has the first frequency band as a pass band, and a second filter that is connected to the 90-degree hybrid coupler and has the second frequency band as a pass band. The second filter includes a first inductor, a resonant circuit, and a second inductor connected in series in this order, a first capacitive element connected between a node on a signal path connecting the first inductor and the resonant circuit and a ground electrode, and a second capacitive element connected between a node on a signal path connecting the second inductor and the resonant circuit and a ground electrode.

12 Claims, 7 Drawing Sheets

RELATED ART
FIG. 1
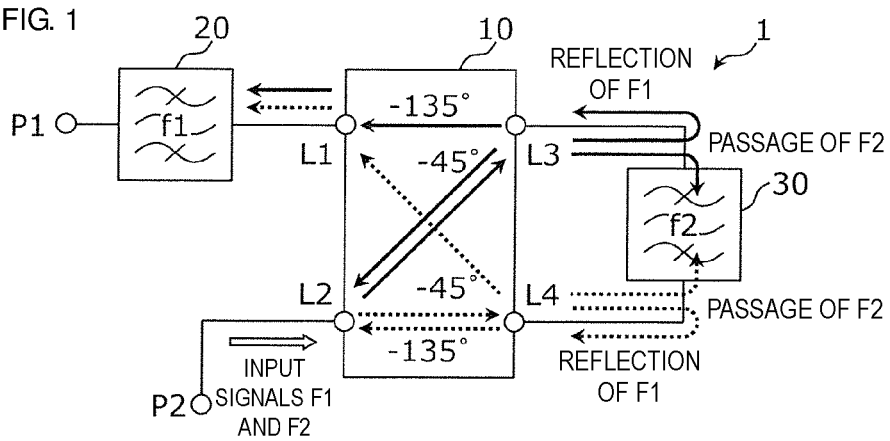
RELATED ART
FIG. 2   BANDPASS CHARACTERISTICS OF FILTER 1 (IN PRINCIPLES)
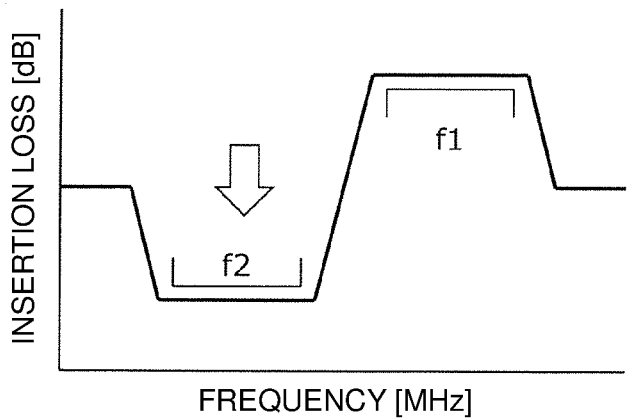

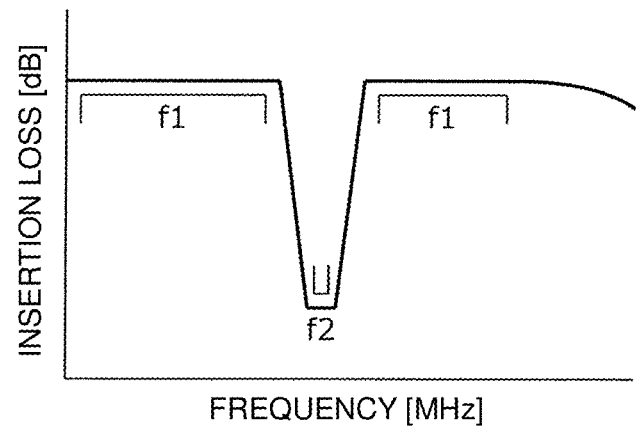
FIG. 11  BANDPASS CHARACTERISTICS OF FILTER 4

FILTER CIRCUIT USING 90-DEGREE HYBRID COUPLER

CROSS REFERENCE TO RELATED APPLICATIONS

This application claims the benefit of priority to Japanese Patent Application No. 2018-235620 filed on Dec. 17, 2018. The entire contents of this application are hereby incorporated herein by reference.

BACKGROUND OF THE INVENTION

1. Field of the Invention

The present invention relates to filter circuits, and, more particularly, to a filter circuit including a 90-degree hybrid coupler.

2. Description of the Related Art

There are filter circuits using 90-degree hybrid couplers in the related art (see, for example, U.S. Patent Application Publication No. 2017/0099652). Such a 90-degree hybrid coupler is an element having a plurality of terminals and configured to distribute an input signal applied to one of the terminals to the other two of the terminals as two signals exhibiting a 90° phase difference. The filter circuit disclosed in U.S. Patent Application Publication No. 2017/0099652 realizes a large attenuation in an attenuation band by having a configuration in which a filter having the attenuation band of the filter circuit as a pass band is connected to the two terminals to which the input signal is distributed.

However, in the filter circuit disclosed in U.S. Patent Application Publication No. 2017/0099652, a ripple sometimes appears in bandpass characteristics.

SUMMARY OF THE INVENTION

Preferred embodiments of the present invention provide filter circuits each including a 90-degree hybrid coupler in which a ripple is less likely to appear in bandpass characteristics.

A filter circuit according to a preferred embodiment of the present invention has a first frequency band as a pass band and a second frequency band as an attenuation band. The filter circuit includes a 90-degree hybrid coupler, a first filter that is connected to the 90-degree hybrid coupler and has the first frequency band as a pass band, and a second filter that is connected to the 90-degree hybrid coupler and has the second frequency band as a pass band. The second filter includes a first inductor, a resonant circuit, and a second inductor connected in series in this order, a first capacitive element connected between a node on a signal path connecting the first inductor and the resonant circuit and a ground electrode, and a second capacitive element connected between a node on a signal path connecting the second inductor and the resonant circuit and a ground electrode.

With this configuration, since the attenuation band of the filter circuit is defined by the second filter that is able to significantly reduce the apparent amount of an unwanted spurious component of the resonant circuit, there can be provided the filter circuit in which a ripple is less likely to appear in bandpass characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a block diagram showing an exemplary configuration and an exemplary operation of a filter circuit in the related art.

FIG. 2 is a diagram showing exemplary bandpass characteristics of a filter circuit in the related art.

FIG. 11 is a diagram showing exemplary bandpass characteristics of a filter circuit according to the second preferred embodiment of the present invention.

DETAILED DESCRIPTION OF THE PREFERRED EMBODIMENTS

Figure 3:
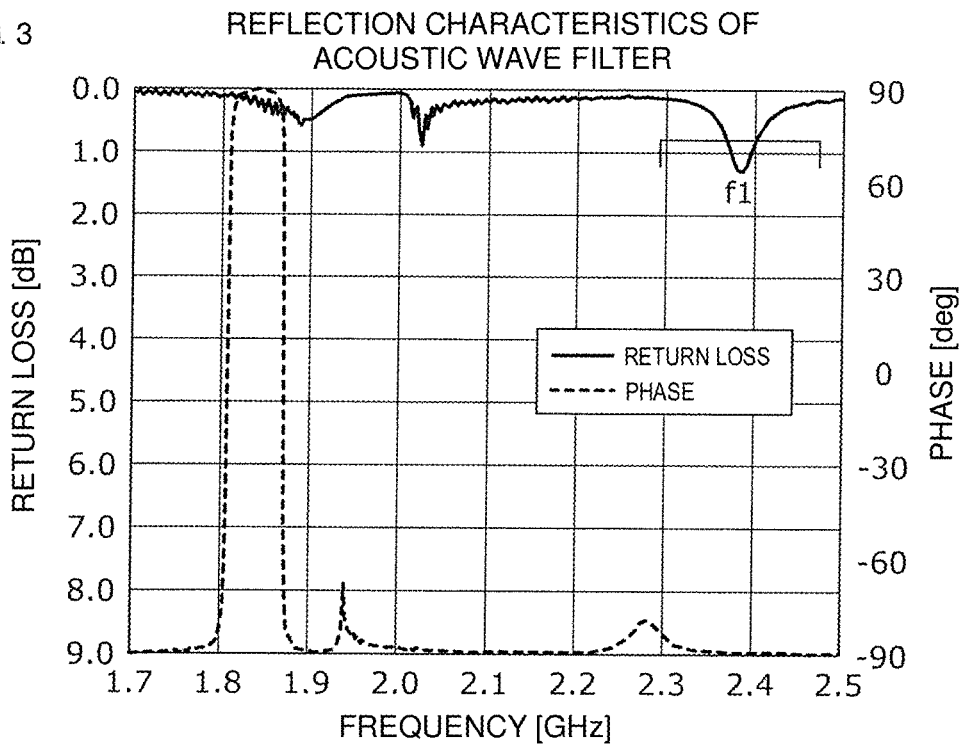
FIG. 3 is a graph showing typical exemplary reflection characteristics of an acoustic wave filter.

Before the description of the preferred embodiments of the present invention, the problem that the inventor of preferred embodiments of the present invention discovered will be described in detail on the basis of the configuration and operation of a filter circuit in the related art.

FIG. 1 is a block diagram showing an exemplary configuration and an exemplary operation of a filter circuit disclosed in U.S. Patent Application Publication No. 2017/0099652. As shown in FIG. 1, a filter circuit 1 includes a 90-degree hybrid coupler 10, a first filter 20, and a second filter 30. The first filter 20 has a first frequency band f1 as a pass band and the second filter 30 has a second frequency band f2 as a pass band. The first frequency band f1 is the pass band of the filter circuit 1. The second frequency band f2 is the attenuation band of the filter circuit 1.

The 90-degree hybrid coupler 10 includes a first terminal L1, a second terminal L2, a third terminal L3, and a fourth terminal L4.

A phase lag between the terminals of the 90-degree hybrid coupler 10 is set for a signal in a frequency band including the first frequency band f1 and the second frequency band f2 as described below. That is, a phase lag between the second terminal L2 and the third terminal L3 is approximately 45 degrees. A phase lag between the second terminal L2 and the fourth terminal L4 is approximately 135 degrees. A phase lag between the third terminal L3 and the first terminal L1 is approximately 135 degrees. A phase lag between the fourth terminal L4 and the first terminal L1 is approximately 45 degrees.

The filter circuit 1 includes a first input/output terminal P1 and a second input/output terminal P2. One end and the other end of the first filter 20 are connected to the first input/output terminal P1 and the first terminal L1, respectively. One end and the other end of the second filter 30 are connected to the third terminal L3 and the fourth terminal L4, respectively. The second input/output terminal P2 is connected to the second terminal L2.

The operation of the filter circuit 1 at the time of, for example, the application of input signals including a signal F1 in the first frequency band f1 and a signal F2 in the second frequency band f2 to the second input/output terminal P2 will be described.

As shown in FIG. 1, the input signals applied to the second input/output terminal P2 are output from the third terminal L3 and the fourth terminal L4. The signals output from the third terminal L3 and the fourth terminal L4 lag the input signals by 45 degrees and 135 degrees, respectively. That is, the signals that are out of phase each other by approximately 90 degrees are output from the third terminal L3 and the fourth terminal L4.

The signal F1 is outside the pass band of the second filter 30. The major portion of the signal F1 output from the third terminal L3 and the fourth terminal L4 is therefore reflected by the second filter 30 and is applied to the third terminal L3 and the fourth terminal L4 again.

The signal F2 is in the pass band of the second filter 30. The signals F2 output from the third terminal L3 and the fourth terminal L4 therefore meet in the second filter 30 and partially cancel each other because they are out of phase with each other by approximately 90 degrees. The attenuated signal F2 is applied to the third terminal L3 and the fourth terminal L4.

The signal applied to the third terminal L3 is transmitted to the first terminal L1 and the second terminal L2 with the phase lags of approximately 135 degrees and approximately 45 degrees, respectively. The signal applied to the fourth terminal L4 is transmitted to the first terminal L1 and the second terminal L2 with the phase lags of approximately 45 degrees and approximately 135 degrees, respectively.

The signal transmitted from the second terminal L2 to the first terminal L1 via the third terminal L3 and the signal transmitted from the second terminal L2 to the first terminal L1 via the fourth terminal L4, which lag the input signals by approximately 180 degrees and are in phase with each other, are added to each other and are then output from the first terminal L1. The signal transmitted back to the second terminal L2 via the third terminal L3 and the signal transmitted back to the second terminal L2 via the fourth terminal L4, which are out of phase with each other, cancel each other and does not appear at the second terminal L2.

Thus, the input signals applied to the second input/output terminal P2 are subjected to reflection and attenuation in the second filter 30, are transmitted to the first terminal L1 in the 90-degree hybrid coupler 10, are processed by the first filter 20, and are then output from the first input/output terminal P1.

FIG. 2 is a diagram showing exemplary bandpass characteristics of the filter circuit 1. By causing the second filter 30 to attenuate the signal F2, there can be provided a filter circuit that has the first frequency band f1 as a pass band and the second frequency band f2 as an attenuation band and has a large attenuation in the second frequency band f2 in the second filter 30.

If a filter using an acoustic wave resonator, for example, a surface acoustic wave resonator or a bulk acoustic wave resonator (hereinafter referred to as an acoustic wave filter) is used as the second filter 30 in the filter circuit 1, only a specific narrow frequency band can be attenuated. However, in an acoustic wave filter, an unwanted spurious component due to the device structure of an acoustic wave resonator is often generated.

FIG. 3 is a graph showing exemplary reflection characteristics of an acoustic wave filter. FIG. 3 shows the increase in a return loss and the change in a phase in the first frequency band f1 as typical examples of an unwanted spurious component generated in an acoustic wave filter. If an acoustic wave filter having an unwanted spurious component is used as the second filter 30 in the filter circuit 1, the undesired attenuation of the signal F1 in the first frequency band f1 may be caused by the second filter 30 and the bandpass characteristics of the filter circuit 1 may be lost.

Figure 4:
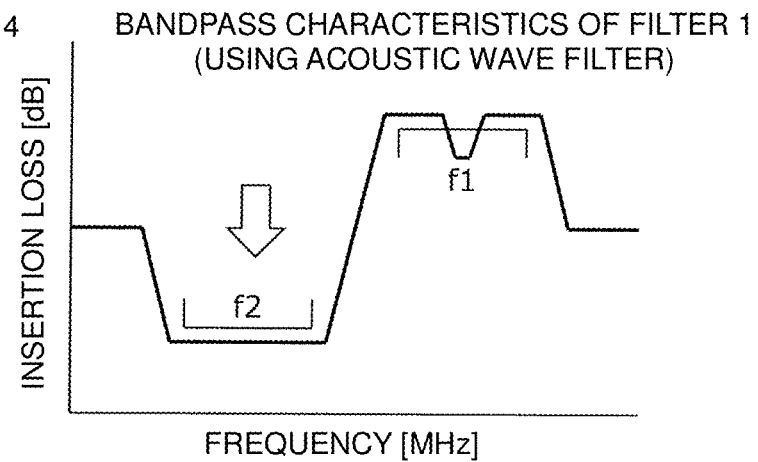
FIG. 4 is a diagram showing exemplary bandpass characteristics of a filter circuit including an acoustic wave filter as a second filter.

FIG. 4 is a diagram showing exemplary bandpass characteristics of the filter circuit 1 including an acoustic wave filter having the reflection characteristics shown in FIG. 3 as the second filter 30. FIG. 4 shows the fact that a large ripple (the increase in a passing loss in a pass band) occurs in the bandpass characteristic of the filter circuit 1 because of an unwanted spurious component (the undesired attenuation of the signal F1) in the second filter 30.

A filter circuit with which the above-described problems are solved will be disclosed below.

Preferred embodiments of the present invention will be described in detail below with reference to drawings. The preferred embodiments to be described below represent a comprehensive or concrete example. The numerical values, shapes, materials, components, the arrangement and connection configurations of the components to be described in the following preferred embodiments are merely examples, and are not intended to limit the present invention.

First Preferred Embodiment

Figure 5:
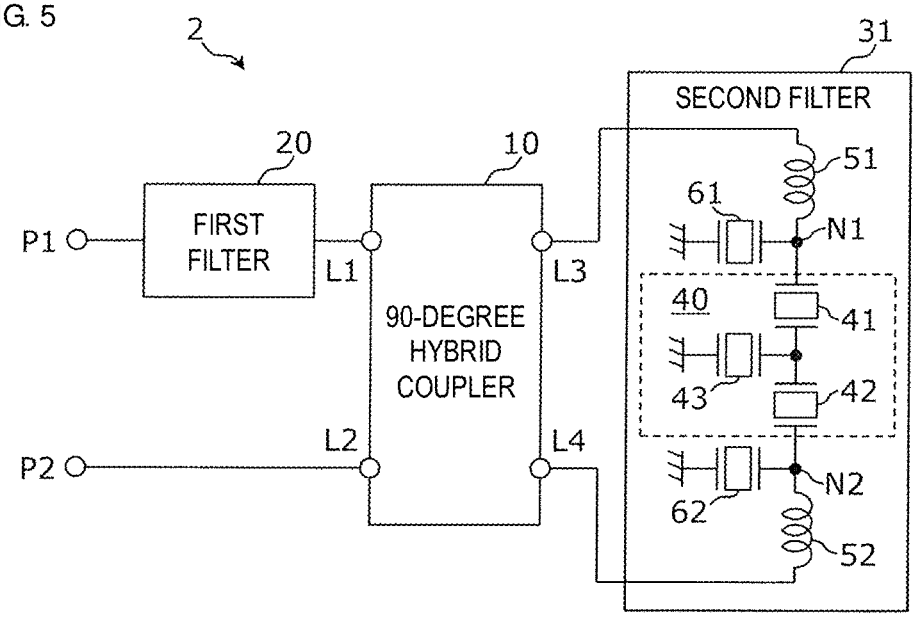
FIG. 5 is a circuit diagram showing an exemplary configuration of a filter circuit according to a first preferred embodiment of the present invention.

FIG. 5 is a circuit diagram showing an exemplary configuration of a filter circuit according to the first preferred embodiment of the present invention. As shown in FIG. 5, a filter circuit 2 has the same or similar configuration as the filter circuit 1 shown in FIG. 1, and differs from the filter circuit 1 in that details of a second filter 31 are specified. The description of points in common with the filter circuit 1 will be omitted as appropriate and different points will be mainly described.

The filter circuit 2 includes the 90-degree hybrid coupler 10, the first filter 20, and the second filter 31. The first filter 20 has the first frequency band f1 that is the pass band of the filter circuit 2 as a pass band. The second filter 31 has the second frequency band f2 that is the attenuation band of the filter circuit 2 as a pass band.

The entire operation of the filter circuit 2 is the same as or similar to that of the filter circuit 1. That is, an input signal applied to the second input/output terminal P2 is subjected to reflection and attenuation in the second filter 31, is transmitted to the first terminal L1 in the 90-degree hybrid coupler 10, is processed by the first filter 20, and is then output from the first input/output terminal P1.

At that time, in the filter circuit 2, the effect of an unwanted spurious component generated in the second filter 31 upon the bandpass characteristics of the filter circuit 2 is significantly reduced by the second filter 31. The configuration and advantageous effect of the second filter 31 will be described below.

The second filter 31 includes a first inductor 51, a resonant circuit 40, a second inductor 52, a first capacitive element 61, and a second capacitive element 62. The first inductor 51, the resonant circuit 40, and the second inductor 52 are connected in series in this order.

The first capacitive element 61 is connected between a node N1 on the signal path connecting the first inductor 51 and the resonant circuit 40 and a ground electrode. The second capacitive element 62 is connected between a node N2 on the signal path connecting the second inductor 52 and the resonant circuit 40 and the ground electrode. Each of the first capacitive element 61 and the second capacitive element 62 is formed of, for example, a surface acoustic wave resonator.

Figure 12A:
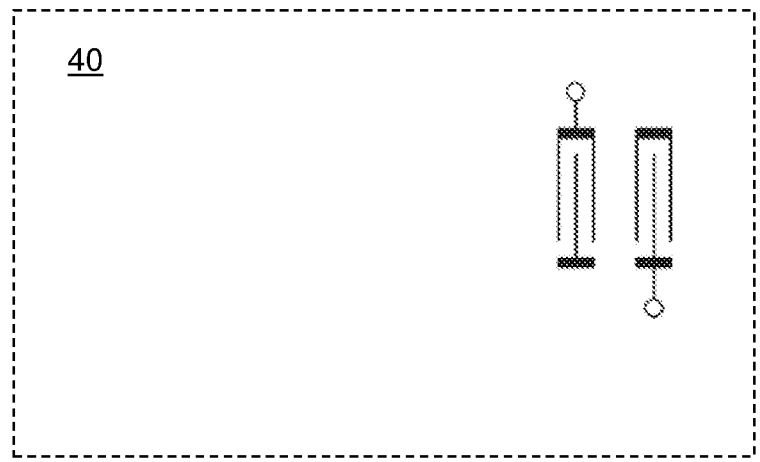
FIG. 12A is a schematic diagram showing an exemplary configuration of a resonant circuit defined by a longitudinally coupled filter.
Figure 12B:
FIG. 12B is a schematic diagram showing an exemplary configuration of a resonant circuit defined by a transversal filter.

The resonant circuit 40 is preferably, for example, an acoustic wave filter including acoustic wave resonators 41, 42, and 43 connected in a ladder configuration. Each of the acoustic wave resonators 41, 42, and 43 may be any one of a surface acoustic wave resonator and a bulk acoustic wave resonator. In this and other examples, the resonant circuit 40 may be defined by an acoustic wave filter, for example, a longitudinally coupled filter (FIG. 12A) or a transversal filter (FIG. 12B).

With the filter circuit 2 having the above configuration, the effect of an unwanted spurious component in the resonant circuit 40 upon the bandpass characteristics of the filter circuit 2 is significantly reduced by the first inductor 51 and the first capacitive element 61 connected one end of the resonant circuit 40 and the second inductor 52 and the second capacitive element 62 connected to the other end of the resonant circuit 40.

This advantageous effect will be described in comparison with a comparative example.

Figure 6:
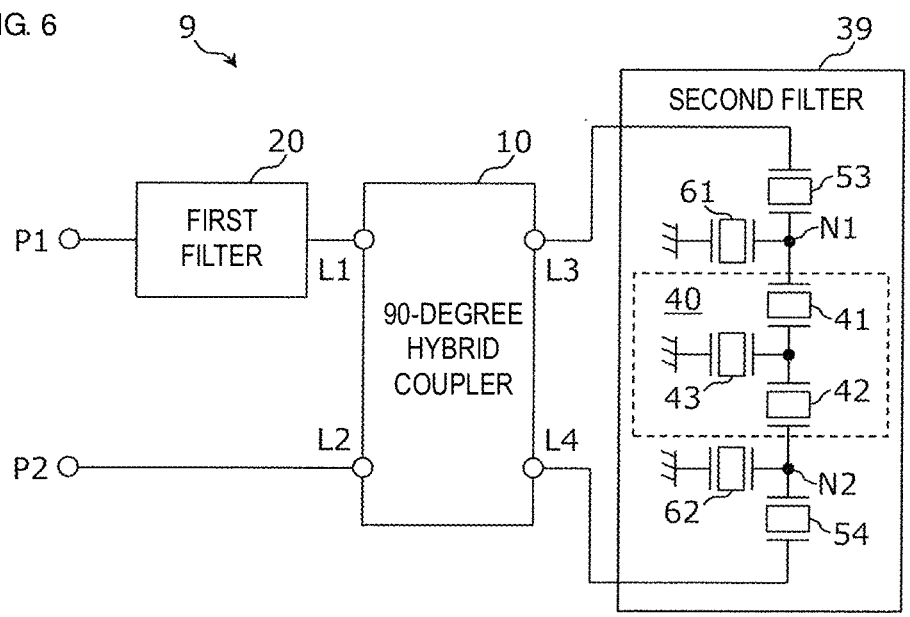
FIG. 6 is a circuit diagram showing an exemplary configuration of a filter circuit that is a comparative example.

FIG. 6 is a circuit diagram showing an exemplary configuration of a filter circuit that is a comparative example. As shown in FIG. 6, a filter circuit 9 differs from the filter circuit 2 shown in FIG. 5 in that the first inductor 51 and the second inductor 52 in the second filter 31 are replaced by acoustic wave resonators 53 and 54 in a second filter 39.

Figure 7:
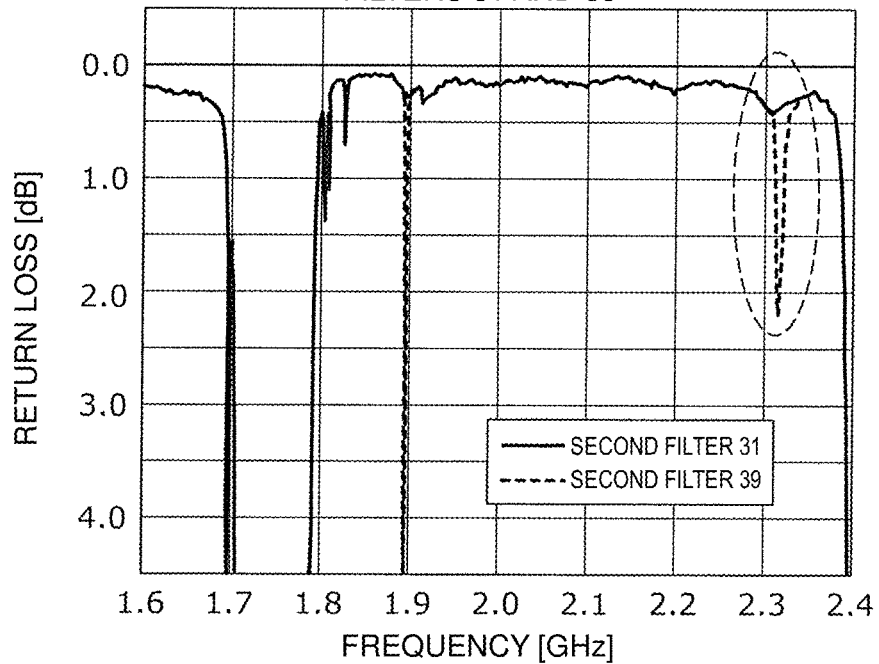
FIG. 7 is a graph showing reflection characteristics of a second filter according to the first preferred embodiment of the present invention.

FIG. 7 is a graph showing exemplary reflection characteristics of the second filters 31 and 39. As shown in a dashed box in FIG. 7, it is discovered that a return loss is improved around approximately 2.3 GHz in the second filter 31 as compared with the second filter 39. That is, the apparent amount of an unwanted spurious component in the resonant circuit 40 is small in the second filter 31.

Accordingly, if an acoustic wave filter having a large unwanted spurious component is used as the resonant circuit 40 in the second filter 31 in the filter circuit 2, the degree of a ripple in the bandpass characteristics of the filter circuit 2 (the increase in a passing loss in the pass band) can be significantly reduced.

The principles on which the above-described advantageous effect is obtained will be described focusing on the configuration of one end portion of the second filter 31.

Figure 8:
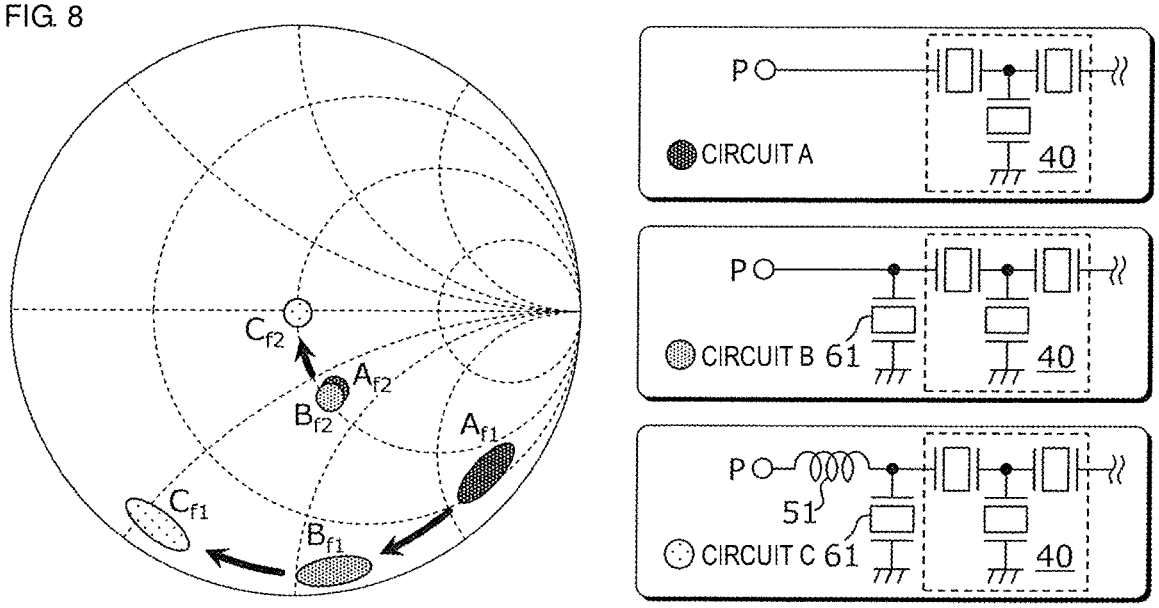
FIG. 8 is a Smith chart describing the effect of a second filter according to the first preferred embodiment of the present invention.

FIG. 8 is a Smith chart describing the effect of the second filter 31. FIG. 8 shows the rough positions of impedances in the first frequency band f1 and the second frequency band f2 (hereinafter merely referred to as impedances) when circuits A, B, and C, which are partial circuits in the second filter 31, are viewed from respective end portions P of these circuits.

The circuit A includes only the resonant circuit 40. The circuit B includes the first capacitive element 61 in addition to the circuit A. The circuit C includes the first inductor 51 in addition to the circuit B. The impedance of each of these circuits is represented by the combination of a reference numeral representing a circuit and a subscript representing a frequency band.

Referring to FIG. 8, the impedance $A_{f2}$ of the circuit A in the second frequency band f2 and the impedance $B_{f2}$ of the circuit B including the first capacitive element 61 in addition to the circuit A in the second frequency band f2 are at the same or substantially the same position. The reason for this is that, in the resonant circuit 40 that is a ladder filter, the anti-resonance point of a parallel resonator, that is, a point having the same or substantially the same impedance as a characteristic impedance, is disposed in the pass band in filter characteristics.

On the other hand, the impedance $A_{f1}$ of the circuit A and the impedance $B_{f1}$ of the circuit B in the first frequency band f1 are significantly different. The addition of the first capacitive element 61 moves the impedance clockwise along a circle of constant conductance. The impedance $B_{f1}$ therefore moves from the impedance $A_{f1}$ to the outer side portion of the Smith chart, that is, in a direction in which a return loss becomes smaller. As a result, the level of an unwanted spurious component that has appeared in the circuit A before the addition of the first capacitive element 61 can be significantly reduced in the circuit B.

However, in the circuit B, the unwanted spurious component of the added first capacitive element 61 appears. The circuit C including the first inductor 51 in addition to the circuit B can make it difficult to view the unwanted spurious component of the first capacitive element 61 in the circuit C, and also move the impedance $C_{f2}$ of the circuit C in the second frequency band f2 closer to the characteristic impedance.

In consideration of the above-described movement of impedance, the initial impedances $A_{f1}$ and $A_{f2}$ of the circuit A are set.

Similar features apply to the opposite end portion of the second filter 31. By connecting the second capacitive element 62 and the second inductor 52 to the other end of the second filter 31, the apparent amount of an unwanted spurious component of the resonant circuit 40 can therefore be significantly reduced when the second filter 31 is viewed from any end portion of the second filter 31.

In the above principles, the first capacitive element 61 and the second capacitive element 62 are used to move the initial impedance of the resonant circuit 40 to the outer side portion of the Smith chart. Accordingly, each of the first capacitive element 61 and the second capacitive element 62 may include not only an acoustic wave resonator but also a capacitance element.

Figure 9:
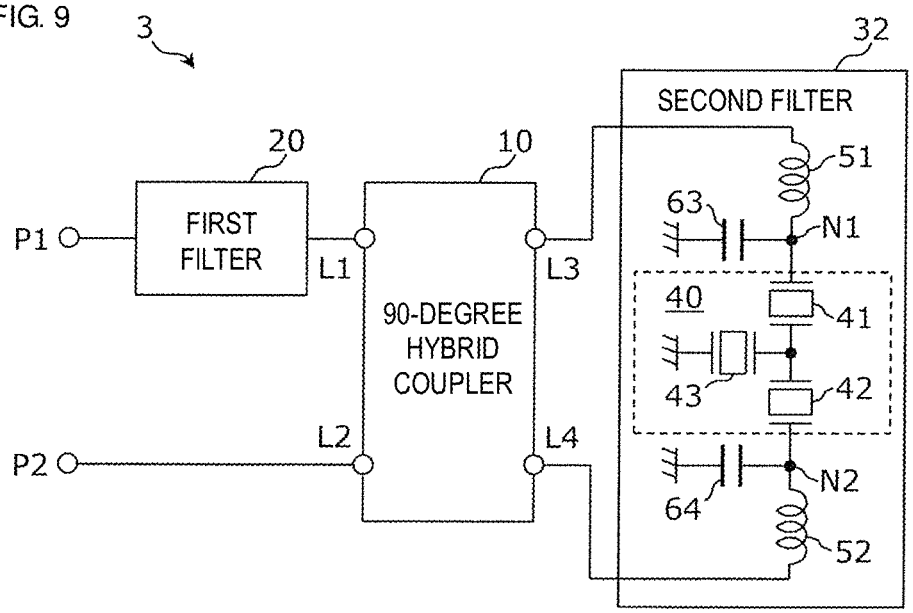
FIG. 9 is a circuit diagram showing an exemplary configuration of a filter circuit that is a modification of the first preferred embodiment of the present invention.

FIG. 9 is a circuit diagram showing an exemplary configuration of a filter circuit that is a modification of the first preferred embodiment. As shown in FIG. 9, a filter circuit 3 differs from the filter circuit 2 shown in FIG. 5 in that each of a first capacitive element 63 and a second capacitive element 64 in a second filter 32 is defined by a capacitance element. Also in the second filter 32 in the filter circuit 3, the apparent amount of an unwanted spurious component of the resonant circuit 40 viewed from one end and the other end of the second filter 32 can be significantly reduced as in the second filter 31 in the filter circuit 2.

With the filter circuits 2 and 3, the degree of a ripple in the bandpass characteristics of the filter circuits 2 and 3 can be significantly reduced because the attenuation bands of the filter circuits 2 and 3 are defined by using the second filters 31 and 32 in which the apparent amount of an unwanted spurious component is small.

Second Preferred Embodiment

Figure 10:
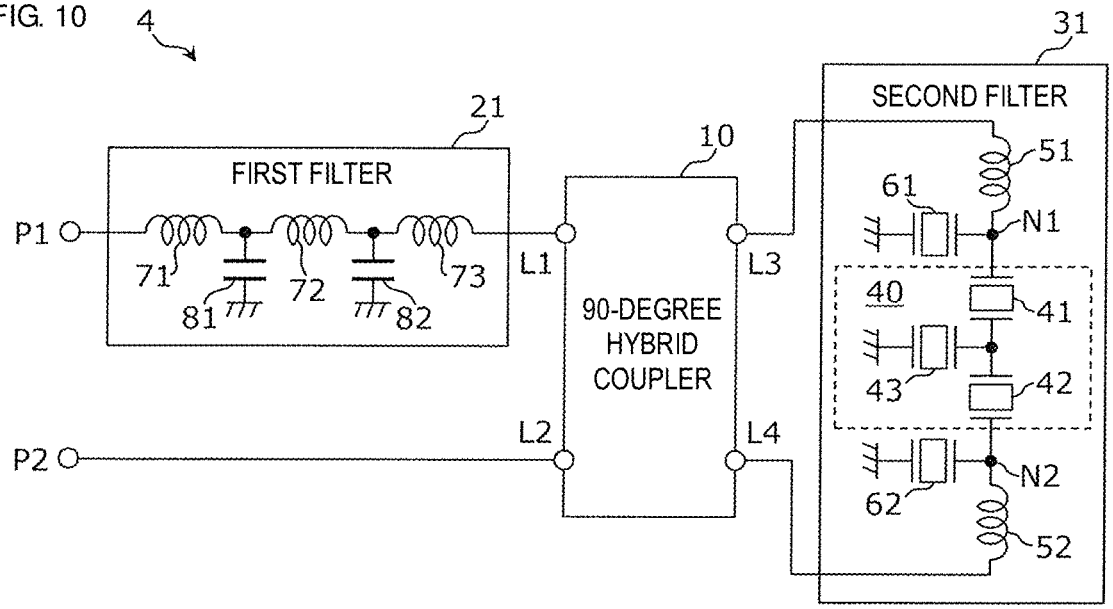
FIG. 10 is a circuit diagram showing an exemplary configuration of a filter circuit according to a second preferred embodiment of the present invention.

FIG. 10 is a circuit diagram showing an exemplary configuration of a filter circuit according to the second preferred embodiment of the present invention. As shown in FIG. 10, a filter circuit 4 differs from the filter circuit 2 shown in FIG. 5 in that details of a first filter 21 are specified.

The first filter 21 is preferably an LC filter in which inductors 71, 72, and 73 and capacitors 81 and 82 are connected in a ladder form.

FIG. 11 is a diagram showing exemplary bandpass characteristics of the filter circuit 4. As shown in FIG. 11, in the filter circuit 4, broadband bandpass characteristics in which only an attenuation in an attenuation band is large can be obtained.

Although filter circuits including a 90-degree hybrid coupler according to the preferred embodiments of the present invention have been described, the present invention is not limited to each preferred embodiment. Various modifications to the preferred embodiments that can be conceived by those skilled in the art, and configurations provided by combining elements in different preferred embodiments without departing from the teachings of the present invention may be included in the scope of the present invention.

CONCLUSION

As described above, a filter circuit according to one of the preferred embodiments of the present invention includes a first frequency band as a pass band and a second frequency band as an attenuation band. The filter circuit includes a 90-degree hybrid coupler, a first filter that is connected to the 90-degree hybrid coupler and has the first frequency band as a pass band, and a second filter that is connected to the 90-degree hybrid coupler and has the second frequency band as a pass band. The second filter includes a first inductor, a resonant circuit, and a second inductor connected in series in this order, a first capacitive element connected between a node on a signal path connecting the first inductor and the resonant circuit and a ground electrode, and a second capacitive element connected between a node on a signal path connecting the second inductor and the resonant circuit and a ground electrode.

Specifically, the filter circuit may further include a first input/output terminal and a second input/output terminal. The 90-degree hybrid coupler may include a first terminal, a second terminal, a third terminal, and a fourth terminal. With respect to a signal in a frequency band including the first frequency band and the second frequency band, a phase lag between the second terminal and the third terminal may be approximately 45 degrees, a phase lag between the second terminal and the fourth terminal may be approximately 135 degrees, a phase lag between the third terminal and the first terminal may be approximately 135 degrees, and a phase lag between the fourth terminal and the first terminal may be approximately 45 degrees. One end and the other end of the first filter may be connected to the first input/output terminal and the first terminal, respectively. One end and the other end of the second filter may be connected to the third terminal and the fourth terminal, respectively. The second input/output terminal may be connected to the second terminal.

Since the attenuation band of the filter circuit is provided by the second filter that is able to significantly reduce the apparent amount of an unwanted spurious component of the resonant circuit, there can be provided a filter circuit in which a ripple is less likely to appear in bandpass characteristics.

The first filter may be an LC filter.

In this case, there can be provided a filter circuit in which a ripple is less likely to appear in bandpass characteristics and a wide pass band is also obtained because of the wideband performance of the LC filter.

The resonant circuit in the second filter may be defined by one or more acoustic wave resonators.

In this case, there can be provided a filter circuit in which a ripple is less likely to appear in bandpass characteristics and only a specific narrow frequency band can also be attenuated because of the steep resonance characteristics of the acoustic wave resonator.

INDUSTRIAL APPLICABILITY

Preferred embodiments of the present invention are applicable to communication devices, for example, cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit having a first frequency band as a pass band and a second frequency band as an attenuation band, comprising:
    a 90-degree hybrid coupler;
    a first filter connected to the 90-degree hybrid coupler and having the first frequency band as a pass band; and
    a second filter connected to the 90-degree hybrid coupler and having the second frequency band as a pass band; wherein
    the second filter includes:
        a first inductor, a resonant circuit, and a second inductor connected in series in this order;
        a first capacitive element connected between a node on a signal path connecting the first inductor and the resonant circuit and a ground electrode; and
        a second capacitive element connected between a node on a signal path connecting the second inductor and the resonant circuit and a ground electrode; and
    the resonant circuit is a longitudinally coupled filter or a transversal filter.

2. The filter circuit according to claim 1, wherein the resonant circuit in the second filter includes one or more acoustic wave resonators.

3. The filter circuit according to claim 2, wherein the one or more acoustic wave resonators are connected in a ladder circuit.

4. The filter circuit according to claim 2, wherein each of the one or more acoustic wave resonators is any one of a surface acoustic wave resonator and a bulk acoustic wave resonator.

5. The filter circuit according to claim 1, further comprising:
    a first input/output terminal; and
    a second input/output terminal; wherein
    the 90-degree hybrid coupler includes a first terminal, a second terminal, a third terminal, and a fourth terminal;

with respect to a signal in a frequency band including the first frequency band and the second frequency band, a phase lag between the second terminal and the third terminal is approximately 45 degrees, a phase lag between the second terminal and the fourth terminal is approximately 135 degrees, a phase lag between the third terminal and the first terminal is approximately 135 degrees, and a phase lag between the fourth terminal and the first terminal is approximately 45 degrees;

one end and another end of the first filter are connected to the first input/output terminal and the first terminal, respectively;

one end and another end of the second filter are connected to the third terminal and the fourth terminal, respectively; and the second input/output terminal is connected to the second terminal.

6. The filter circuit according to claim 5, wherein a major portion of a signal output from the third terminal and a major portion of a signal output from the fourth terminal are reflected by the second filter.

7. The filter circuit according to claim 6, wherein the signal output from the third terminal and the signal output from the fourth terminal at least partially cancel one another in the second filter.

8. The filter circuit according to claim 5, wherein a phase lag between the third terminal and the fourth terminal is approximately 90 degrees.

9. The filter circuit according to claim 1, wherein each of the first capacitive element and the second capacitive element is a surface acoustic wave resonator.

10. The filter circuit according to claim 1, wherein each of the first capacitive element and the second capacitive element is a capacitance element.

11. The filter circuit according to claim 1, wherein the first filter is defined by an LC filter.

12. The filter circuit according to claim 11, wherein the first filter includes a plurality of capacitors and a plurality of inductors that are electrically connected to define a ladder filter.

* * * * *